(12) United States Patent
Olgado et al.

(10) Patent No.: US 6,802,947 B2
(45) Date of Patent: Oct. 12, 2004

(54) APPARATUS AND METHOD FOR ELECTRO CHEMICAL PLATING USING BACKSIDE ELECTRICAL CONTACTS

(75) Inventors: Donald J. K. Olgado, Palo Alto, CA (US); Michael Wood, San Jose, CA (US); Dmitry Lubomirsky, Cuppertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 273 days.

(21) Appl. No.: 09/981,191

(22) Filed: Oct. 16, 2001

(65) Prior Publication Data

US 2004/0173454 A1 Sep. 9, 2004

(51) Int. Cl.[7] .......................... C25D 17/00; C25D 17/04
(52) U.S. Cl. ............. 204/224 R; 204/289; 204/297.03; 204/275.1; 204/212
(58) Field of Search ..................... 204/297.03, 224 R, 204/289, 275.1, 212; 205/574–576

(56) References Cited

U.S. PATENT DOCUMENTS

| | | | | |
|---|---|---|---|---|
| 5,228,966 A | * | 7/1993 | Murata | 204/224 R |
| 5,997,701 A | | 12/1999 | Bock | 204/225 |
| 6,017,585 A | | 1/2000 | Thomas | 427/240 |
| 6,071,388 A | | 6/2000 | Uzoh | 204/297 R |
| 6,080,291 A | | 6/2000 | Woodruff et al. | 204/297.01 |
| 6,136,163 A | | 10/2000 | Cheung et al. | 204/198 |
| 6,139,712 A | | 10/2000 | Patton et al. | 205/143 |
| 6,143,086 A | | 11/2000 | Tepman | 118/728 |
| 6,159,354 A | | 12/2000 | Contolini et al. | 205/96 |
| 6,180,291 B1 | | 1/2001 | Bessy et al. | 430/5 |
| 6,193,859 B1 | | 2/2001 | Contolini et al. | 204/224 R |
| 6,200,634 B1 | | 3/2001 | Johnsgard et al. | 427/248.1 |
| 6,251,236 B1 | | 6/2001 | Stevens | 204/224 R |
| 6,274,013 B1 | | 8/2001 | Bleck et al. | 204/297.08 |

FOREIGN PATENT DOCUMENTS

| | | | |
|---|---|---|---|
| JP | 60-172291 | 9/1985 | C12P/7/52 |
| JP | 63-118093 | 5/1988 | C25D/5/18 |
| WO | 97/12079 | 4/1997 | C25D/5/02 |
| WO | 99/25904 | 5/1999 | C25D/5/02 |
| WO | 99/25905 | 5/1999 | C25D/5/02 |

OTHER PUBLICATIONS

Kenneth E. Pitney, "NEY Contact Manual," Electrical Contacts for Low Energy Uses, 1973, no month.

Peter Singer, "Tantalum, Copper and Damascene: The Future of Interconnects," Semiconductor International, Jun. 1998, pp. Cover, 91–92, 94, 96 & 98.

* cited by examiner

Primary Examiner—Donald R. Valentine
(74) Attorney, Agent, or Firm—Moser, Patterson & Sheridan

(57) ABSTRACT

An apparatus and method for securing and electrically contacting a substrate on a non-production surface of the substrate. The apparatus includes a substrate holder assembly having a substrate engaging surface formed thereon, the substrate engaging surface being configured to engage a substrate on the non-production surface. The apparatus further includes an electrical contact device positioned on the substrate engaging surface, the electrical contact device including a plurality of radially spaced electrically conductive members configured to electrically communicate with the non-production surface of the substrate positioned on the substrate engaging surface. The method includes depositing a conductive seed layer on a production surface of the substrate, and depositing a backside conductive layer on a portion of the non-production side of the substrate, the backside conductive layer extending around a bevel of the substrate to electrically communicate with the seed layer. The method further includes securing the substrate in a chuck configured to engage the non-production surface of the substrate, contacting the backside conductive layer with an electrical cathode contact on the non-production side of the substrate, and plating over the conductive seed layer via application of an electrolyte to the production surface of the substrate and applying an electrical bias to the electrical cathode contact and an anode in communication with the electrolyte.

26 Claims, 8 Drawing Sheets

APPARATUS AND METHOD FOR ELECTRO CHEMICAL PLATING USING BACKSIDE ELECTRICAL CONTACTS

BACKGROUND OF THE INVENTION

1. Field of the Invention

The present invention generally relates to an electroplating apparatus and method using backside electrical contacts.

2. Description of the Related Art

The production of sub-micron sized semiconductor features is a key technology for the next generation of very large scale integration (VLSI) and ultra large scale integration (ULSI) semiconductor devices. However, next generation ULSI and VLSI devices will require a substantial decrease in the interconnect dimensions, which imposes substantial additional manufacturing demands. Further, the multilevel interconnects that lie at the heart of these technologies requires precise processing of high aspect ratio features, such as vias and other interconnects. Reliable formation of these multilevel vias and interconnects is important to the success of VLSI and ULSI devices, and to the continued effort to increase circuit density and quality of individual substrates.

As circuit densities increase, the widths of vias, contacts, and other features, as well as the dielectric materials between them, decreases to sub-micron dimensions, while the thickness of the respective dielectric layers generally remains constant. This results in the aspect ratios for the features, i.e., the feature height divided by width, increasing substantially. Traditional deposition processes, such as chemical vapor deposition (CVD) and physical vapor deposition (PVD), for example, generally have difficulty filling sub-micron sized structures where the aspect ratio of the structure exceeds 2:1, and particularly when the aspect ratio exceeds 4:1. Conventional methods are known to leave voids in sub-micron features that render the feature inefficient or inoperable. Therefore, there is a substantial amount of ongoing effort being directed toward discovering alternative methods for forming substantially void-free sub-micron features having high aspect ratios.

Additionally, traditional systems have used aluminum and its alloys to form interconnects. However, currently, copper and its alloys have become the metals of choice for sub-micron interconnect technology, as copper is known to have a lower resistivity than aluminum, (1.7 $\mu\Omega$-cm compared to 3.1 $\mu\Omega$-cm for aluminum), a higher current density, and significantly higher electromigration resistance. These characteristics are important for supporting the higher current densities experienced at high levels of integration and increased device speed. Further, copper has a good thermal conductivity, is readily available in a highly pure state, and offers excellent adhesion characteristics to silicon.

Although copper is a desirable metal for semiconductor devices, the fabrication choices for depositing copper into very high aspect ratio features, such as 4:1 or greater having 0.351 $\mu$ (or less) wide vias, are limited, as CVD and PVD are generally not viable deposition options. As a result of these process limitations, electroplating techniques, which have previously been limited to the fabrication of larger a lines and other features on circuit boards, are now being investigated as a possible method for efficiently and effectively filling sub-micron sized features on semiconductor devices.

Electroplating processes for semiconductor devices typically require a thin, continuous, electrically conductive seed layer to be deposited on the substrate. Electroplating a desired metal is then generally accomplished by applying an electrical bias to the seed layer and exposing the substrate to an electrolytic solution containing metal ions that will plate over the seed layer in the presence of the electrical bias. The seed layer generally is formed of a conductive metal, such as copper, for example, and is conventionally deposited on the substrate using PVD or CVD techniques.

FIG. 1 is a cross sectional view of a conventional fountain plater 100. Generally, the fountain plater 100 includes an electrolyte container 112 having a top opening, a substrate holder 114 disposed above the electrolyte container 112, an anode 116 disposed at a bottom portion of the electrolyte container 112, and a contact ring 120 contacting the production surface of a substrate 122 in order to provide an electroplating bias voltage to the seed layer on the substrate. A plurality of grooves 124 are formed in the lower surface of the substrate holder 114, and a vacuum pump (not shown) is generally coupled to substrate holder 114 and communicates with the grooves 124 to create a vacuum condition capable of securing the substrate 122 to the substrate holder 114 during processing. Contact ring 120 generally includes a plurality of metallic or semi-metallic contact pins 126 distributed about the peripheral portion of the substrate 122 to define a central substrate plating surface. The plurality of contact pins 126 generally extend radially inwardly over a portion of the perimeter of the substrate 122 and contact the conductive seed layer of substrate 122 with the tips of the contact pins 126. A power supply (not shown) is attached to pins 126 and is configured to provide an electrical bias to the substrate 122. The substrate 122 is positioned above the cylindrical electrolyte container 112 and electrolyte flow impinges in a generally perpendicular manner on a substrate plating surface during operation of cell 100.

However, one problem encountered in utilizing conventional electroplating processes for manufacture of semiconductor devices is that the electrical contacts used to provide the plating bias to the substrate surface contact the production surface of the substrate. Although the contacts are generally positioned about the perimeter of the substrate, i.e., within the outer 2–6 millimeters of the substrate (preferably in the 3–4 millimeter range), and therefore, contact the substrate in the outer 2–6 millimeter band, the contacts nonetheless occupy valuable surface area on the substrate that may be used for production. In a 200 mm substrate, for example, the outer 6 mm band of the substrate that is used to accommodate the contact pins in a conventional electroplating apparatus occupies approximately 6,500 mm$^2$, which is surface area on the production surface of the substrate that may be used for device production.

Further, when electrical contacts are placed on the production surface, generally the configuration includes at least one seal that is used to prevent electrolyte from coming into contact with the contact pins, as this causes plating on the contacts and decreases the effectiveness and consistency of the plating apparatus. Therefore, conventional production surface contact configurations require substantial effort to prevent electrolyte from coming into contact with the contact pins. Additionally, the production surface contact pins cause a disturbance of the plating field lines and may trap air bubbles proximate the substrate surface when the substrate is lowered into the electrolyte solution for plating.

Therefore, there exists a need for an apparatus and method for plating substrates using electrical contacts configured to engage the substrate on the non-production surface.

SUMMARY OF THE INVENTION

Embodiments of the invention generally provide an electro-chemical deposition processing cell having a head assembly with a substrate holder and a cathode. An electrolyte container positioned proximate the head assembly and having an anode disposed therein is included, and a power supply in electrical communication with the cathode and the anode is provided. The substrate holder is configured to mechanically and electrically engage a substrate on the non-production side of the substrate during an electroplating process.

Embodiments of the invention further provide an apparatus for securing and electrically contacting a substrate on a non-production surface of the substrate. The apparatus includes a substrate holder assembly having a substrate engaging surface formed thereon, the substrate engaging surface being configured to engage a substrate on the non-production surface. The apparatus further includes an electrical contact device positioned on the substrate engaging surface, the electrical contact device including a plurality of radially spaced electrically conductive members configured to electrically communicate with the non-production surface of the substrate positioned on the substrate engaging surface.

Embodiments of the invention further provide method for electroplating on a semiconductor substrate using backside mechanical and electrical contacts. The method includes depositing a conductive seed layer on a production surface of the substrate, and depositing a backside conductive layer on a portion of the non-production side of the substrate, the backside conductive layer extending around a bevel of the substrate to electrically communicate with the seed layer. The method further includes securing the substrate in a chuck configured to engage the non-production surface of the substrate, contacting the backside conductive layer with an electrical cathode contact on the non-production side of the substrate, and plating over the conductive seed layer via application of an electrolyte to the production surface of the substrate and applying an electrical bias to the electrical cathode contact and an anode in communication with the electrolyte.

Embodiments of the invention further provide an electrochemical deposition processing cell having means for supporting a substrate via engagement with a non-production side of the substrate, means for electrically contacting the non-production side of the substrate, an electrolyte container positioned proximate the means foe supporting and having an anode disposed therein, and a power supply in electrical communication with the cathode and the anode.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
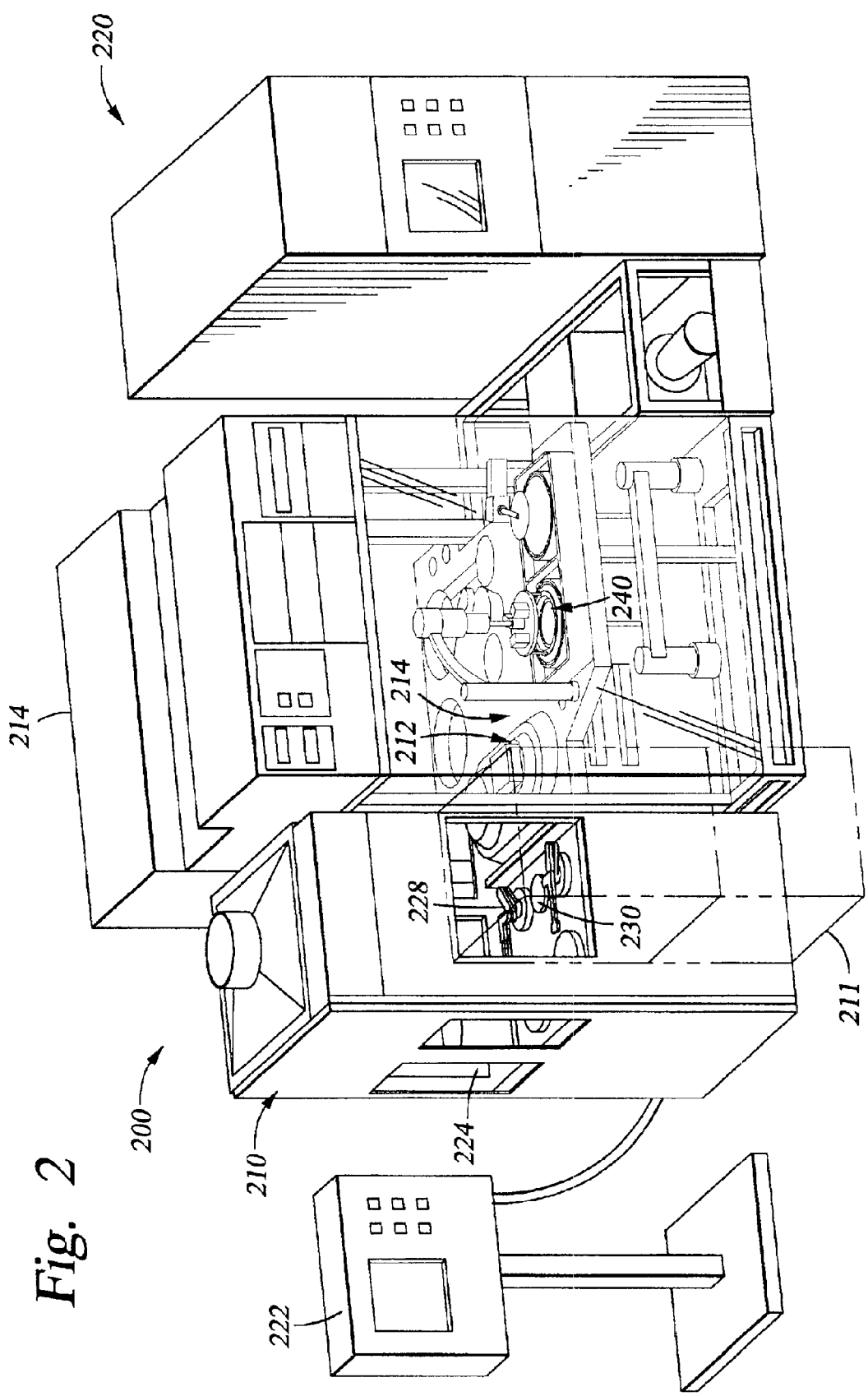
FIG. 2 illustrates a perspective view of an exemplary electroplating system of the invention.
Figure 3:
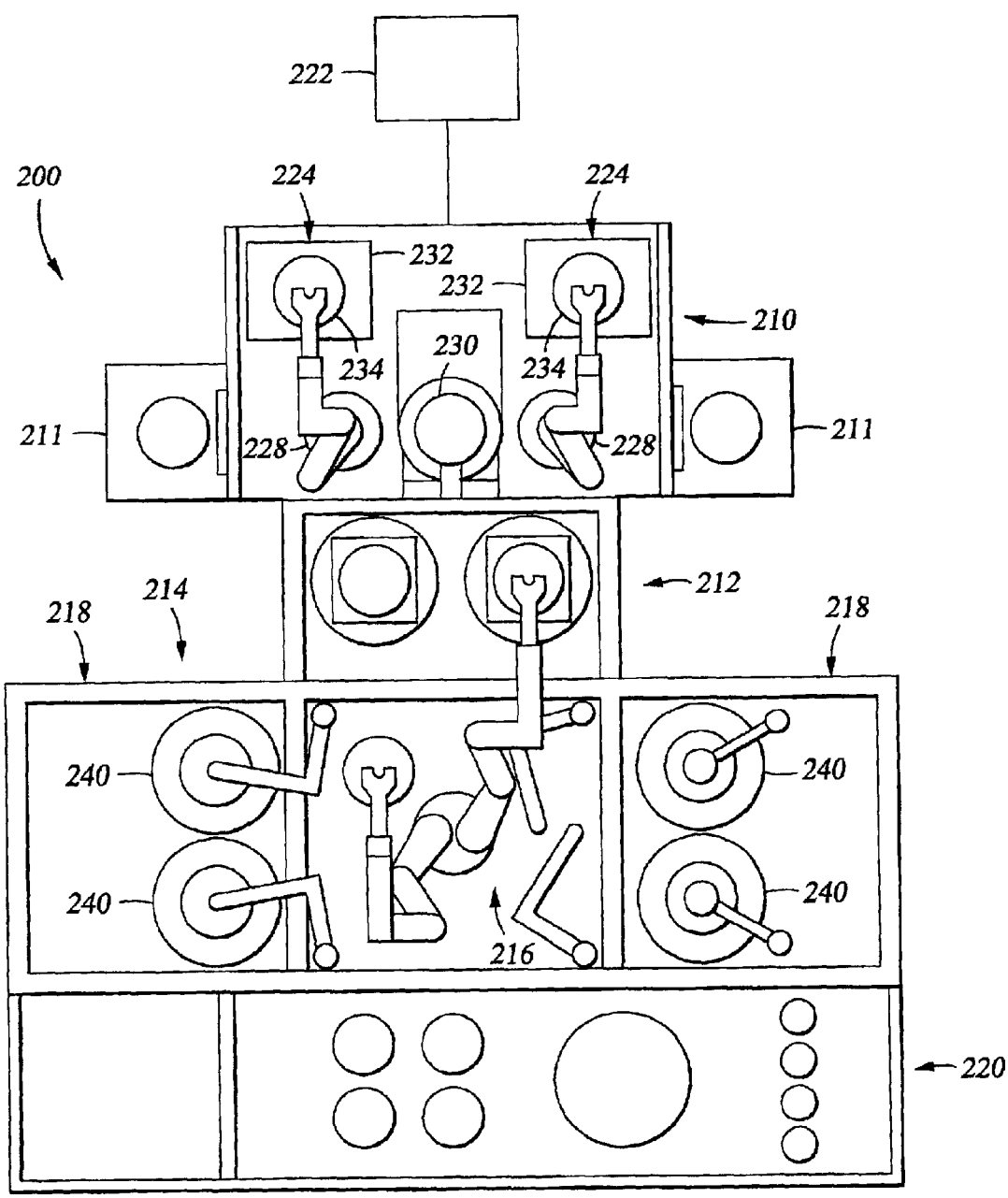
FIG. 3 illustrates a plan view of an exemplary electroplating system of the invention.

FIG. 2 is a perspective view of an electroplating system platform 200 of the invention. FIG. 3 is a schematic plan view of the electroplating system platform 200 of the invention. Referring cooperatively to both FIGS. 2 and 3, the electroplating system platform 200 generally includes a loading station 210, a thermal anneal chamber 211, a spin-rinse-dry (SRD) station 212, a mainframe 214, and an electrolyte replenishing system 220. Preferably, the electroplating system platform 200 is enclosed in a clean room-type environment using, for example, plexiglass panels. The mainframe 214 generally includes a mainframe transfer station 216 and a plurality of processing stations 218. Each processing station 218 includes one or more processing cells 240. An electrolyte replenishing system 220 is positioned adjacent the electroplating system platform 200 and individually in fluid communication with process cells 240 in order to circulate electrolyte to cells 240 that will be used for the electroplating process. The electroplating system platform 200 also generally includes a control system 222, which may be a programmable microprocessor configured to interface with the various components of the system platform 200 and provide controlling signals thereto. Control system 222 may generally operate to control the cooperative operation of each of the components that together form electroplating system platform 200.

Figure 1:
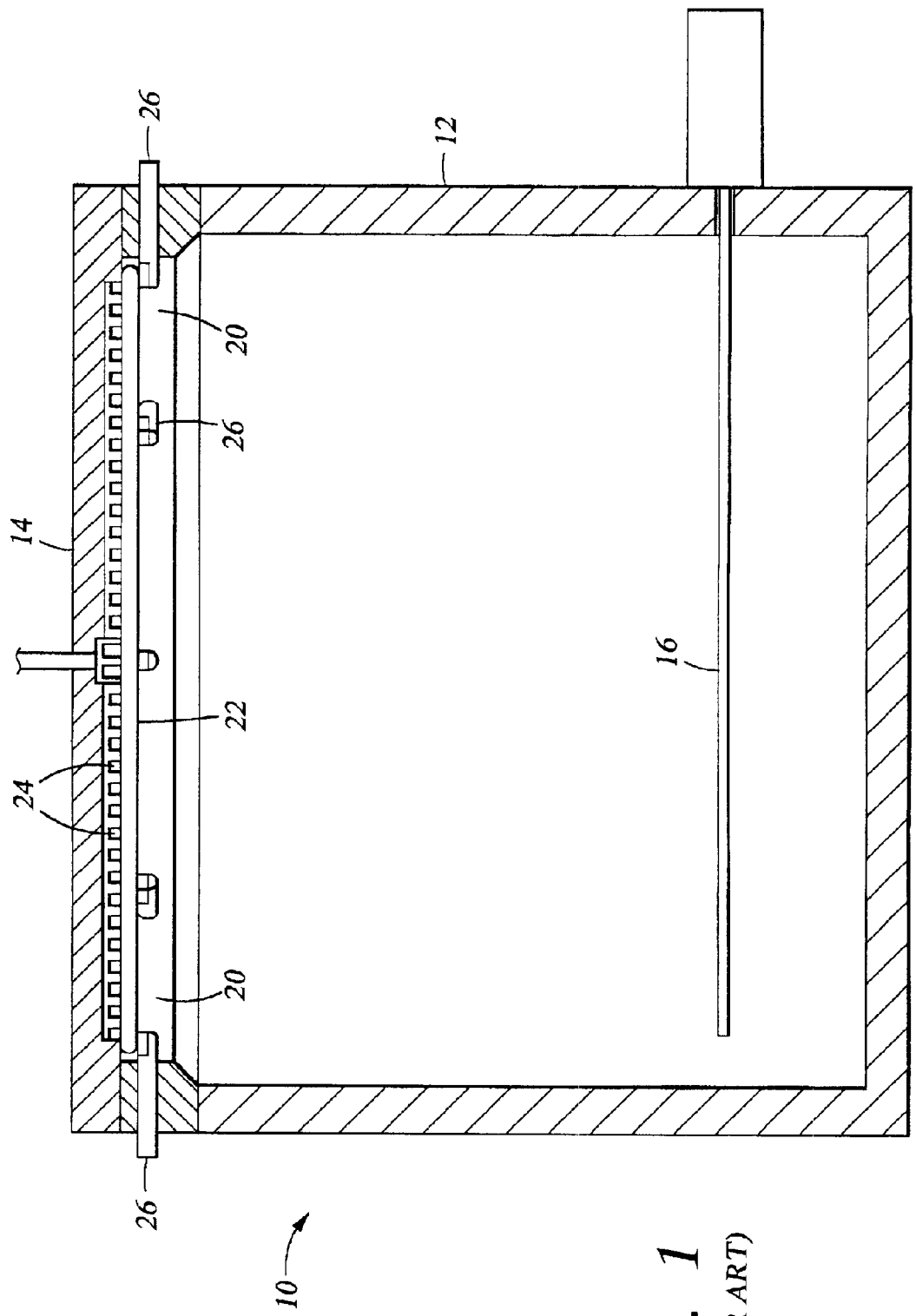
FIG. 1 illustrates a sectional view of a conventional fountain plating cell.

The loading station 210 generally includes one or more substrate cassette receiving areas 224, one or more loading station transfer robots 228, and at least one substrate orientor 230. The number of substrate cassette receiving areas 224, loading station transfer robots 228, and substrate orientors 230 included in the loading station 210 may be configured according to the desired throughput of the system. As shown for one embodiment in FIGS. 1 and 2, the loading station 210 includes two substrate cassette receiving areas 224, two loading station transfer robots 228, and one substrate orientor 230. A substrate cassette 232 containing substrates 234 is loaded onto the substrate cassette receiving area 224 to introduce substrates 234 into the electroplating system platform. The loading station transfer robot 228 transfers substrates 234 between the substrate cassette 232 and the substrate orientor 230. The loading station transfer robot 228 generally includes a typical transfer robot, as is generally known in the art. The substrate orientor 230 positions each substrate 234 in a desired orientation to ensure that the substrate is properly processed. The loading station transfer robot 228 also transfers substrates 234 between the loading station 210 and the SRD station 212, and between the loading station 210 and the thermal anneal chamber 211.

Figure 4:
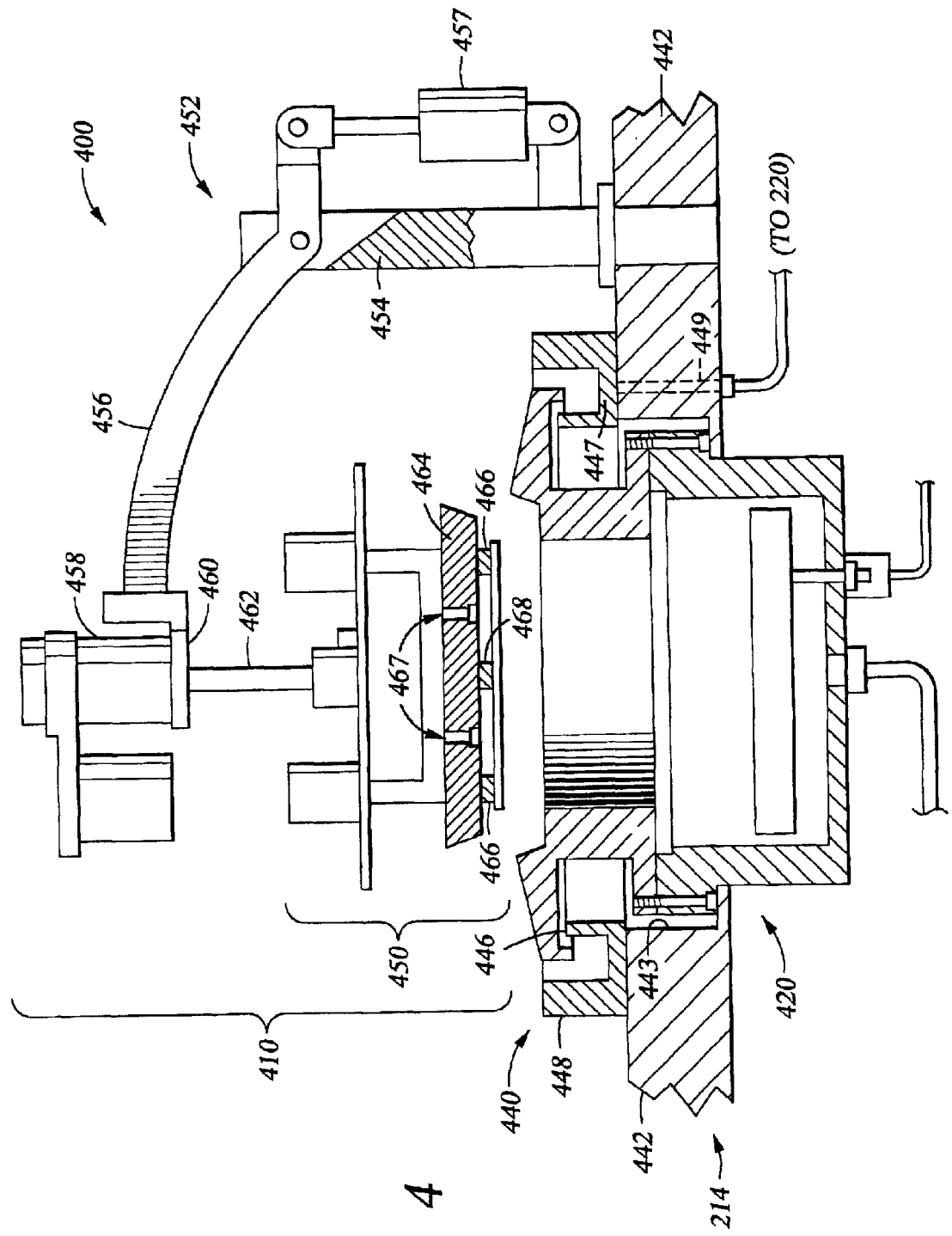
FIG. 4 illustrates a sectional view of an exemplary plating cell of the invention.

FIG. 4 is a cross sectional view of an exemplary electroplating process cell 400 of the invention. The electroplating process cell 400 is generally the same as the electroplating process cell 240 as shown in FIG. 3. The processing cell 400 generally includes a head assembly 410, a process kit 420 and an electrolyte collector 440. Preferably, the electrolyte collector 440 is secured onto the body 442 of the mainframe 214 over an opening 443 that defines the location for placement of the process kit 420. The electrolyte collector 440 includes an inner wall 446, an outer wall 448, and a bottom 447 connecting the respective walls. An electrolyte outlet 449 is disposed through the bottom 447 of the electrolyte collector 440 and connected to the electrolyte replenishing system 220 through tubes, hoses, pipes or other fluid transfer connectors.

Head assembly 410 is mounted onto a head assembly frame 452 that includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process kit 420 to provide the spacing required to remove and/or replace the process kit 420 from the electroplating process cell 400. When the cantilever arm actuator 457 is extended, the cantilever arm 456 moves the head assembly 410 toward the process kit 420 to position the substrate in the head assembly 410 in a processing position.

Head assembly 410 includes a substrate holder assembly 450 and a substrate assembly actuator 458. The substrate assembly actuator 458 is mounted onto the mounting plate 460, and includes a head assembly shaft 462 extending downwardly through the mounting plate 460. The lower end of the head assembly shaft 462 is connected to the substrate holder assembly 450 and operates to position the substrate holder assembly 450 in either a processing position or a substrate loading position. The substrate holder assembly 450 generally includes a substrate holder 464 and an integrally formed cathode contact ring 466. In general, contact ring 466 includes an annular body having a plurality of conducting members disposed thereon for communicating electrical energy to a substrate positioned on the holder assembly 450. The annular body of the contact ring 466 is generally constructed of an insulating material in order to electrically isolate the plurality of conducting members from surrounding components other than the substrate. The body and conducting members of the contact ring 466 generally form a diametrically interior substrate seating surface which, during processing, may support the substrate being processed by the apparatus 400. The contact ring of the invention, however, is configured to electrically engage and contact the substrate being processed on the non-production side of the substrate, i.e., on the back side of the substrate, so that the production side of the substrate is free of electrical or mechanical contacts therewith. Substrate holder assembly 450 may further include a plurality of vacuum channels 467 formed in a lower side of the substrate holder assembly for securing a substrate to the holder assembly 450. Vacuum channels 467, which are generally in communication with a pump (not shown), may be, for example, annularly positioned about the lower surface of the substrate holder assembly 450 and configured to provide sufficient vacuum pressure to secure a substrate thereto for processing.

Additionally, a substrate support spacer 468 may be positioned on the lower surface of the substrate support assembly 450 in order to prevent the substrate from bowing as a result of the vacuum pressure being applied to the back side of a substrate via vacuum channels 467 in the process of securing the substrate to the substrate support assembly 450.

Figure 5:
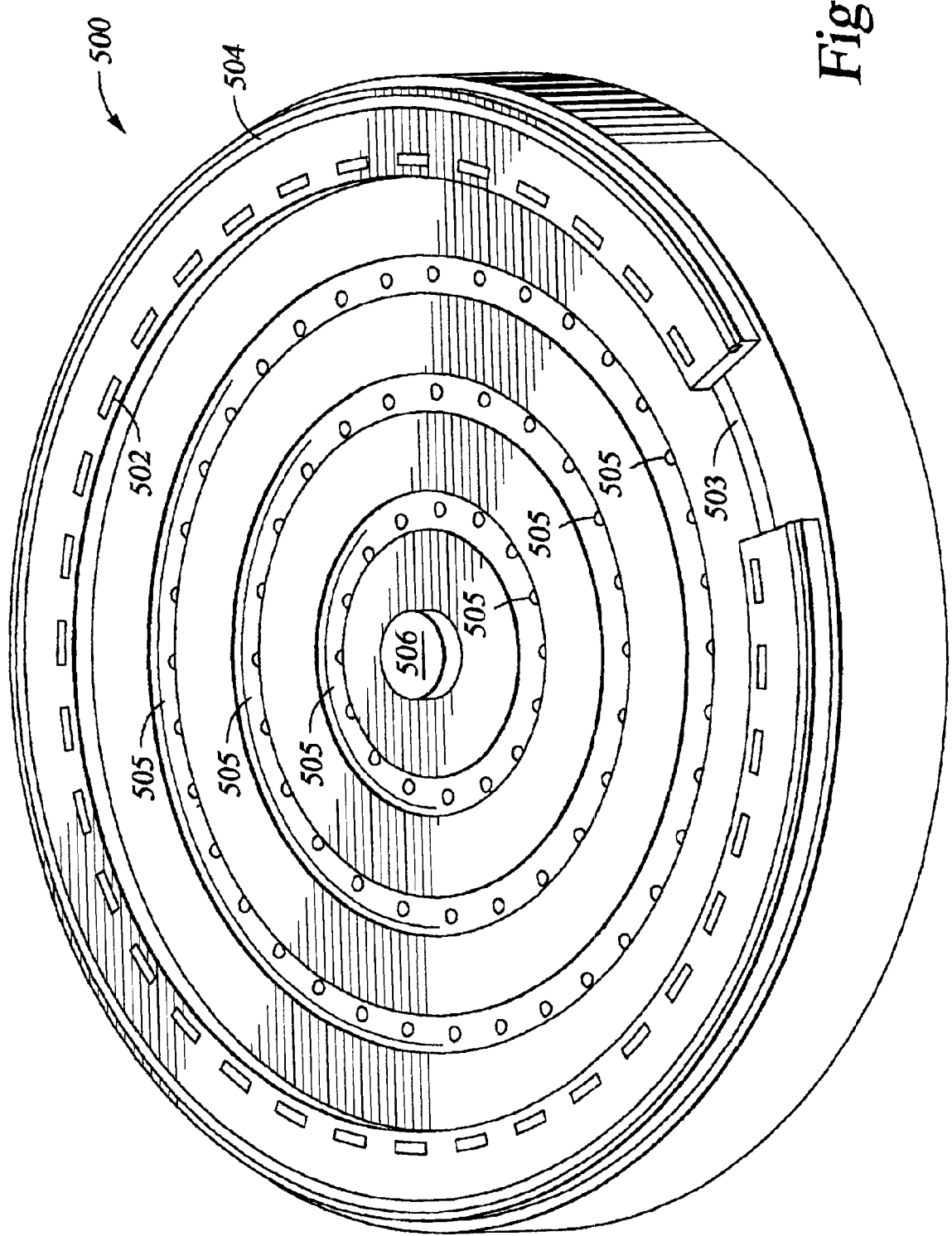
FIG. 5 illustrates a sectional view of an exemplary substrate holder and contact ring assembly of the invention.
Figure 7:
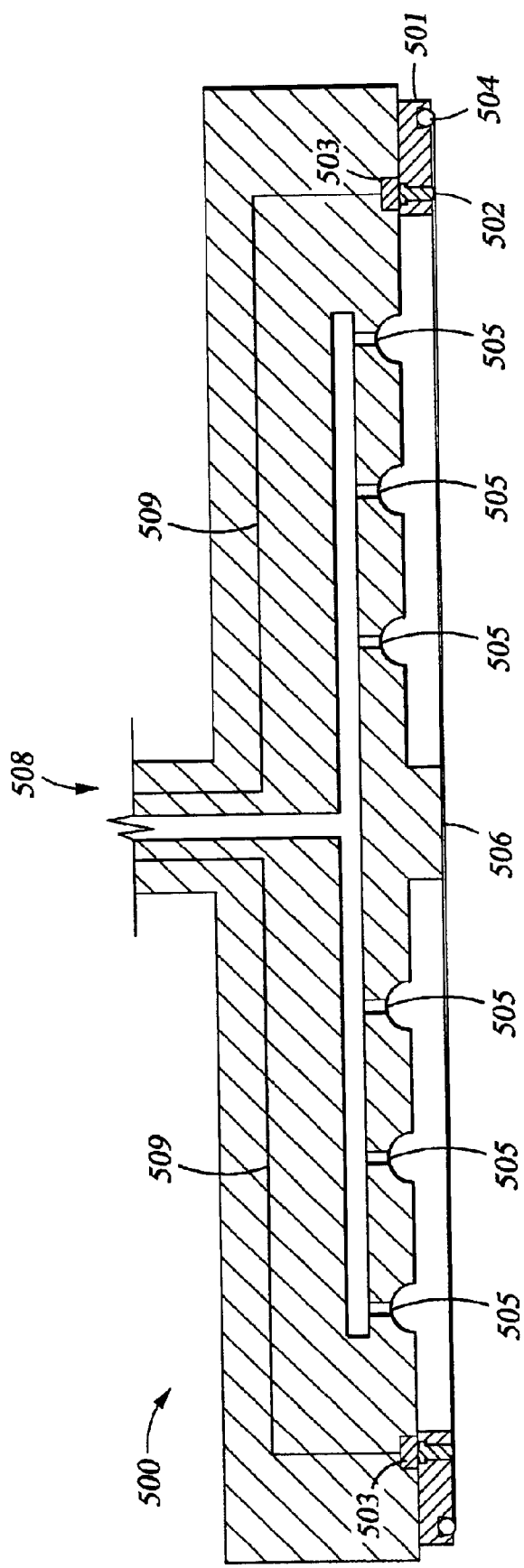
FIG. 7 illustrates a perspective view of an exemplary substrate holder of the invention.

FIG. 5 illustrates a sectional view of an exemplary substrate support assembly 500 of the invention. FIG. 7 illustrates a perspective view having a partial sectional view therein of the exemplary substrate support assembly 500 of the invention. Substrate support assembly 500 generally includes a circular or disk shaped member having an upper surface 508 and a lower surface, where the lower surface is configured to receive, secure, and electrically contact a substrate. A substrate may generally be secured to substrate support assembly 500 through a vacuum chucking process, whereby a vacuum source (not shown) may be in communication with a plurality of vacuum channels, ports, or other apertures 505 formed on the lower surface of the substrate support assembly 500 in a configuration calculated to secure/chuck a substrate to the lower surface upon application of a sufficient negative pressure/vacuum to the plurality of channels 505. The vacuum source (not shown) may be in communication with the apertures 505 via a vacuum conduit formed in substrate support assembly 500. The negative pressure applied to the apertures 505 through conduit operates to bias or chuck a substrate against an annular cathode a contact ring 501 positioned about the perimeter of the lower surface of substrate support assembly 500. A center substrate support member 506 is positioned proximate the center of substrate support assembly 500. Center support member 506 generally operates as a central support member or spacer between the lower surface of the substrate support member 500 and the substrate chucked to support assembly 500, as the vacuum chucking process may cause the central portion of a substrate to bow towards support assembly 500. Therefore, center support member may be configured to support the central portion of a substrate and prevent excessive substrate deflection or bowing as a result of the vacuum chucking process.

The annular cathode contact ring 501 is fixedly attached to the lower surface of substrate support 500 proximate the perimeter thereof. Alternatively, the cathode contact ring 501 may be integrally formed into the lower surface of substrate support 500. The cathode contact ring generally includes a seal 504, which may be an O-ring type seal, and a plurality of conductive substrate contacts 502 positioned radially inward from seal 504. Seal 504 provides a seal/barrier that prevents electrolyte from flowing/traveling to the back side/contact side of the substrate. This seal/barrier allows contacts 502 to remain dry during plating processes, which eliminates problems associated with the electrolyte plating on the contacts and causing varying resistances therein. However, the present invention is not limited to configurations using an outer seal configuration, as it is contemplated that the seal may be positioned radially inward from contacts 502 in a wet contact-type configuration. Seal 504 may be manufactured from various materials known in the art to provide sealing capability and to maintain integrity in the presence of an electrolyte. Examples of material that may be used for seal 504 may include plastic compounds, Teflon®, Nylon® compounds, rubber compounds, and other materials used to manufacture seals that are acceptable sealing material for plating apparatuses. Further, the outer surfaces of the contact ring 501 that are exposed to the electrolyte may be coated or treated to provide a hydrophilic surface in order to encourage electrolyte flow and contact therewith. The main body portion of contact ring 501 may be manufactured from an insulative material, such as an insulative plastic, polyvinylidenefluoride (PVDF), perfluoroalkoxy resin (PFA), Teflon™, Tefzel™, Alumina (Al$_2$O$_3$), ceramics, and/or other suitable insulative materials, while the contacts 502 are manufactured from a conductive material.

The plurality of substrate contacts 502, which are manufactured from an electrically conductive material, are generally in communication with one or more electrical supply contacts 503 positioned on the lower surface of the substrate support 500 adjacent the plurality of substrate contacts 502, as shown in FIG. 7. Electrical supply contacts 503 may be used to communicate electrical energy from a power supply (not shown) in electrical communication with the electrical supply contacts 503 via conductors 509 to the plurality of electrical contacts 502. Electrical supply contacts 503 may be a conductive annular ring formed into the lower surface of the substrate holder 500 that is configured to electrically engage each of the plurality of electrical contacts 502 in the cathode contact ring 501 when ring 501 is mounted to substrate holder 500. Alternatively, electrical supply contacts 503 may include a plurality of individual electrical supply contacts 503 formed into the lower surface of the substrate holder 500. In this configuration, each of contacts 503 may be radially positioned to cooperatively contact and electrically engage each of the individual plurality of electrical contacts 502 in the cathode contact ring 501. Therefore, each of contacts 503 may be configured to supply a specific individual electrical bias to each of the contacts 502, through, for example, the use of a controller configured to individually regulate the bias applied to each of the contacts in order to control the uniformity of the electrical bias applied to the substrate. The regulation of the electrical bias applied to each of the contacts 502 may be, for example, implemented through a selectively controllable variable resistor positioned in series with each of contacts 502. Regardless of the configuration, supply contact(s) 503 operate to communicate electrical energy to the plurality of electrical contacts 502 in cathode contact ring 501. Contacts 502, which are configured to electrically engage a conductive surface of a substrate, may be manufactured from an electrically conductive material, such as copper (Cu), platinum (Pt), tantalum (Ta), titanium (Ti), gold (Au), silver (Ag), stainless steel, or other conductive materials. Low resistivity and low contact resistance, which are desired characteristics for contacts 502, may further be achieved by coating contacts 502 with An additional conductive material. Therefore, contacts 502 may, for example, be made of copper (resistivity for copper is approximately $2\times10^8$ Ω·m) and be coated with platinum (resistivity for platinum is approximately $10.6\times10^8$ Ω·m). Additionally, coatings such as tantalum nitride (TaN), titanium nitride (TiN), rhodium (Rh), gold (Au), Copper (Cu), or Silver (Ag) may be used on base materials such as stainless steel, molybdenum (Mo), Cu, and Ti.

Figure 6A:
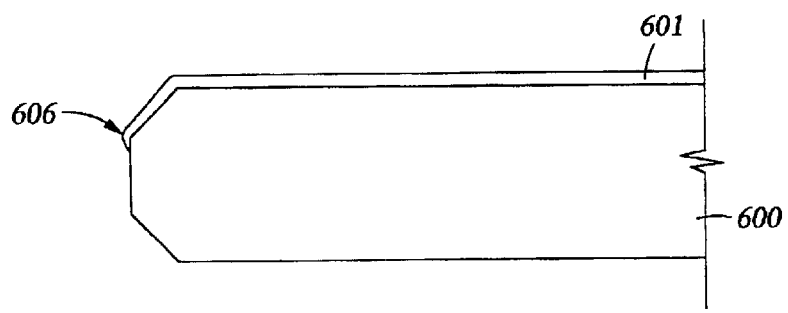
FIGS. 6a–6d illustrate an exemplary electroplating sequence using a backside contact configuration.
Figure 6B:
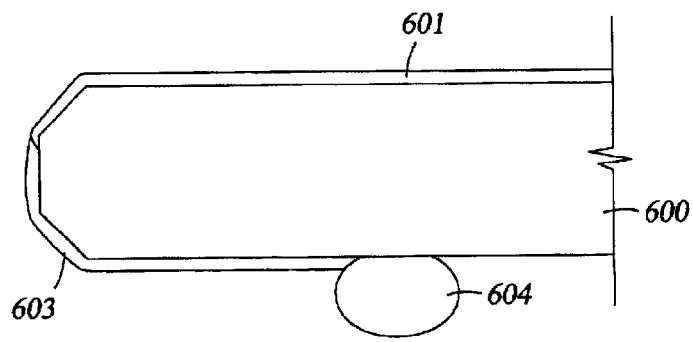

FIGS. 6a–6d illustrate an exemplary electroplating method using the backside contact configuration of the invention. The exemplary electroplating method generally begins with the deposition of a conductive seed layer 601 on a substrate 600. The seed layer 601, which may be copper, for example, may be deposited through CVD, PVD, or other deposition techniques. Seed layer 601 generally covers the production surface of substrate 600, i.e., the top surface of the substrate, and terminates proximate the edge or bevel 606 of the substrate 600. Seed layer 601 will generally be extended around the edge or bevel 606 to the backside of substrate 600, as illustrated in FIG. 6b, in order to make electrical contact with the back side of substrate 600 and have the backside contact be in electrical communication with the production surface seed layer 601. The extension of the seed layer 601 to the backside of substrate 600 may include deposition of a backside conductive layer 603, as shown in FIG. 6b. Backside layer 603 may be deposited though known deposition techniques, such as CVD, an electroless deposition process, or other deposition techniques. In the present exemplary embodiment, an electroless deposition process may be preferred, as electroless processes are known to be an efficient seed layer repair process used in device fabrication, and therefore, a conventional seed layer repair step may be modified to include depositing the backside conductive layer 603. A deposition seal 604 may be used in the electroless deposition process to limit the deposition width of conductive backside layer 603 to a predetermined area or band proximate the periphery of substrate 600. The predetermined backside deposition area or band may be calculated to be sufficient to establish backside contact, while not requiring substantial additional effort to remove the backside conductive layer 603. Therefore, the width of deposition may be, for example, between about 3 millimeters and about 6 millimeters, preferably between about 3 and 4 millimeters, as these radius ranges generally allow sufficient area for electrical contact and seal configurations. Additionally, the other physical characteristics of backside layer 603, such as layer thickness, layer uniformity, and layer resistivity, for example, may be selected to provide electrical power to seed layer 601 through a minimal resistance path so that the current provided to seed layer 601 for an electroplating process may be essentially equal around the circumference of substrate 600.

Figure 6C:
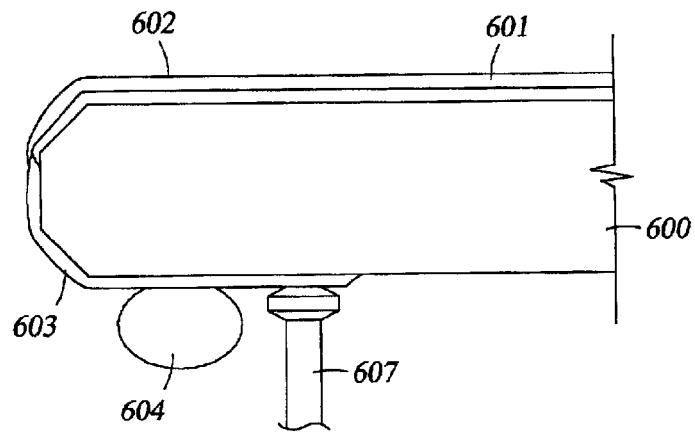
Figure 6D:
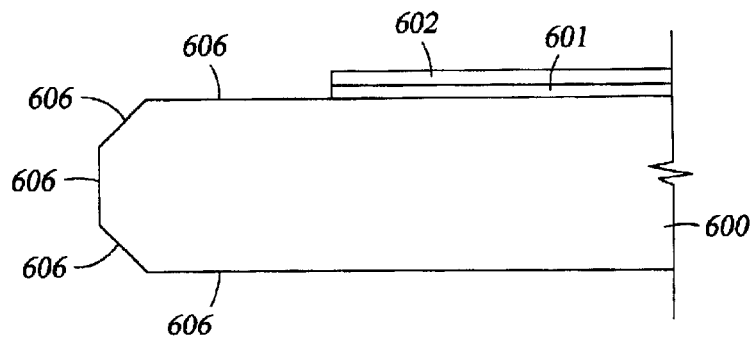

Once the backside conductive layer 603 is deposited, the electroplating process for substrate 600 may be conducted. The electroplating process generally involves exposing the seed layer 601 to an electrolyte rich in plating ions and supplying an electrical bias to the seed layer 601 sufficient to draw the plating ions from the electrolyte and cause the plating ions to plate on the seed layer 601. FIG. 6c illustrates a simplified electroplating process where a backside electrical contact 607, which is in communication with a power supply (not shown), is used to communicate an electrical bias to the backside conductive layer 603. Although only a single contact is illustrated in FIG. 6c, the exemplary embodiment may implement a plurality of contacts configured to supply an even current distribution to the back side conductive layer 603 and the seed layer 601. The applied electrical bias applied to the back side conductive layer 603 travels through layer 603 to the seed layer 601, which then causes the plating ions in the electrolyte to plate on the seed layer 601, thus forming the plating layer 602. A seal 604 may be used to prevent the electrolyte from reaching contacts 607, thus creating a dry contact plating configuration, which operates to prevent plating on contacts 607 as a result of the plating electrolyte being contained to a region away from contacts 607 by seal 604. Alternatively, seal 604 may be positioned radially inward from contacts 607, thus resulting in a wet contact configuration, if desired. Once plating layer 602 is formed on the production surface, an edge bead removal process may be conducted in order to remove the back side conductive layer 603 and the portion of the seed layer 601 and the plating layer 602 that overlap the edge or bevel 606. When the edge bead removal process is complete, as shown in FIG. 6d, substrate 600 has completed the plating process.

Although the structural configuration of the invention is illustrated as being a face down-type configuration in FIGS. 4 and 5, the invention is not limited to these face down-type configurations. Rather, embodiments of the invention contemplate that the backside electrical contact configuration may be utilized in either face down or face up type substrate processing apparatuses and processes, along with other configurations and/or orientations. Therefore, for example, a substrate may be processed in a configuration where the production side of the substrate is facing upward and the electrical contact with the substrate is made on the non-production side or back side of the substrate that would be facing down or at an angle to the horizontal. Similarly, although a vacuum chucking process is illustrated in the exemplary embodiments shown in FIGS. 4 and 5, the invention is not in any way limited to utilization of a vacuum chuck, as various other processes and techniques for securing a substrate or substrate to a processing table or device are contemplated within the scope of the invention. Furthermore, although embodiments of the invention are directed primarily toward electroplating, it is contemplated that the structure and method of the invention may be implemented into other similar processes.

Figure 8:
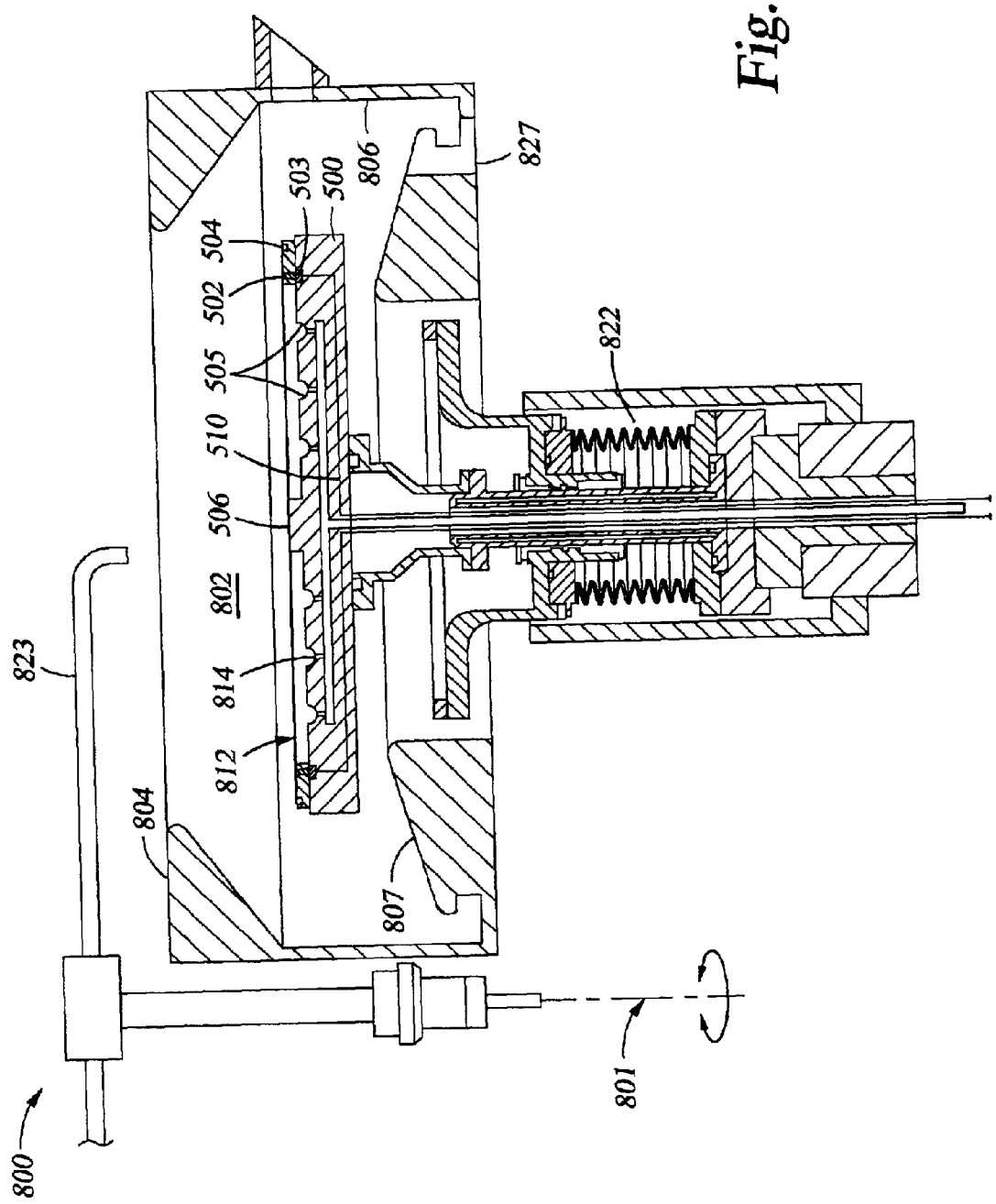
FIG. 8 illustrates an exemplary electrochemical plating/deplating process cell implementing a substrate holder of the invention.

FIG. 8 illustrates an exemplary plating or deplating processing cell 800 utilizing an embodiment of the substrate holder of the invention. Processing cell 800 generally includes a processing compartment 802 having a top 804, sidewalls 806, and a bottom 807. A substrate support 812 is disposed in a generally central location in the chamber 800, and includes a substrate receiving surface 814 configured to receive a substrate in a "face-up" position, i.e. in a position where the production surface of the substrate is facing away from the substrate support 812. Substrate support 812 may be manufactured form an insulative material, such as ceramic materials, alumina ($Al_2O_3$), TEFLON™ coated metal (such as aluminum or stainless steal), silicon carbide (SiC), or other suitable materials. An insulating electrical contact ring 500 is mounted proximate the perimeter of substrate support 812 and includes a plurality of conductive electrical contacts 502 and an annular seal member 504. Contacts 502, which are in electrical communication with an electrical supply contact 503 formed into substrate support member 812, receive electrical energy from supply contacts 503 and transfer the electrical energy to the non-production side of the substrate position on the substrate support 812. Supply contacts 503 are generally in communication with a power supply (not shown) via electrical conduits 509. Receiving surface 814 may include one or more vacuum channels, ports, or apertures 505 in communication with a vacuum source. Channels 505, when supplied with a negative pressure from the vacuum source, are configured to secure or chuck a substrate to substrate support 812 for processing thereon. A motor 822 may be coupled to the substrate support 812 in order to selectively rotate the substrate support 812 to spin a substrate positioned thereon.

A fluid dispensing unit, such as a rotatably mounted nozzle 823, may be disposed in the chamber 800 to deliver a fluid, such as a chemical processing solution, an etchant, deionized water, and/or an acid solution, to the surface of a substrate positioned on the support 812. Nozzle 823 may be disposed over the center of a substrate in order to deliver a fluid to the center of the substrate. Alternatively, nozzle 823 may be rotated about an axis 801 in order to dispense fluid over any radial position of the substrate when the substrate is rotated. Nozzle 823 may further be in communication with either a cathode or an anode, depending upon whether the processing cell 800 is configured as a deplating cell or a plating cell, respectively. Similarly, contact ring 501 may be in communication with a cathode or an anode, depending upon whether the processing cell is configured as a plating cell or a deplating cell, respectively. Chamber 800 further includes a drain 827 in order to collect and expel fluids used in the chamber 800.

In a plating/deplating process, a substrate having a backside conductive layer deposited thereon may be placed on substrate support surface 814 by, for example, a robot. The substrate may then be vacuum chucked to the substrate support surface through application of a negative pressure to the vacuum apertures or grooves 505, which causes the substrate to be vacuum chucked to the substrate support surface 814. Further, when the substrate is vacuum chucked to the substrate support surface 814, the backside conductive layer of the substrate is also caused to electrically engage contacts 502 and mechanically engage seal 504. Once the substrate is chucked, a plating/deplating fluid may be dispensed from nozzle 823 onto the production surface of the substrate. Simultaneously, a plating/deplating electrical bias may be applied to the substrate production surface via contacts 502 and nozzle 823, which are in communication with a cathode and anode, depending upon whether the cell is plating or deplating. Motor 822 may rotate the substrate while the arm of nozzle 823 is pivoted over the production surface of the substrate dispensing the plating or deplating fluid thereon. The fluid chemically reacts with the substrate surface to either plate or deplate the surface, runs off of the edge of the substrate as a result of the centrifugal force generated by the rotating substrate, and is captured by the cell drain 827.

While the foregoing is directed to embodiments of the present invention, other and further embodiments of the invention may be devised without departing from the basic scope thereof, and the scope thereof is determined by the claims that follow.

What is claimed is:

1. An electro-chemical deposition processing cell, comprising:
   a cathode substrate holder configured to mechanically and electrically engage a substrate on a non-production side of the substrate wherein the cathode substrate holder comprises an annular member having a lower surface, the lower surface having a plurality of vacuum channels formed thereon and an annular cathode contact ring affixed thereto;
   an electrolyte container positioned below the substrate holder, the container having a plating solution and an anode disposed therein; and
   a power supply in electrical communication with the cathode substrate holder and the anode;
   wherein the cathode contact ring further comprises an insulative body having a plurality of electrically conductive substrate contacts radially positioned about a perimeter of the insulative body.

2. An electro-chemical deposition processing cell, comprising:
   a cathode substrate holder configured to mechanically and electrically engage a substrate on a non-production side of the substrate wherein the cathode substrate holder comprises an annular member having a lower surface, the lower surface having a plurality of vacuum channels formed thereon and an annular cathode contact ring affixed thereto;
   an electrolyte container positioned below the substrate holder, the container having a plating solution and an anode disposed therein; and a power supply in electrical communication with the cathode substrate holder and the anode;

wherein the cathode contact ring further comprises an insulative body having an annular seal positioned radially outward from a plurality of electrical substrate contacts.

3. The processing cell of claim 2, wherein the plurality of electrical substrate contacts are dry electrical contacts.

4. An electro-chemical deposition processing cell, comprising:
   a cathode substrate holder configured to mechanically and electrically engage a substrate on a non-production side of the substrate;
   an electrolyte container positioned below the substrate holder, the container having a plating solution and an anode disposed therein; and
   a power supply in electrical communication with the cathode substrate holder and the anode;
   wherein the anode comprises a plurality of electrical contact members extending into the electrolyte container into an anode plate.

5. An electro-chemical deposition processing cell, comprising:
   a cathode substrate holder configured to mechanically and electrically engage a substrate on a non-production side of the substrate wherein the substrate holder further comprises a disk shaped member mounted to a lower portion of a head assembly, the disk shaped member having a substrate engaging surface formed thereon;
   an electrolyte container positioned below the substrate holder, the container having a plating solution and an anode disposed therein; and
   a power supply in electrical communication with the cathode substrate holder and the anode;
   wherein the substrate holder further comprises a disk shaped member mounted to a lower portion of a head assembly, the disk shaped member having a substrate engaging surface formed thereon; and
   wherein the disk shaped member further comprises:
   an annular seal positioned proximate an outer periphery of the substrate engaging surface, the annular seal being configured to engage the non-production side of the substrate when the substrate is secured to the substrate engaging surface; and
   a plurality of conductive electrical contacts radially positioned about the substrate engaging surface, the plurality of conductive electrical contacts being configured to electrically engage the non-production side of the substrate when the substrate is secured to the substrate engaging surface.

6. The processing cell of claim 5, wherein the annular seal is positioned radially outward from the plurality of conductive electrical contacts.

7. The processing cell of claim 5, wherein the annular seal is positioned radially inward from the plurality of conductive electrical contacts.

8. An apparatus for securing and electrically contacting a substrate on a non-production surface of the substrate, comprising:
   a substrate holder assembly having a substrate engaging surface formed thereon; and
   an electrical contact device positioned on the substrate engaging surface and having a plurality of radially spaced electrically conductive members configured to electrically communicate with a non-production surface of the substrate positioned on the substrate engaging surface.

9. The apparatus of claim 8, wherein the substrate holder assembly further comprises a vacuum operated substrate chuck.

10. The apparatus of claim 8, wherein the substrate holder assembly further comprises a disk shaped member having at least one vacuum channel formed therein that terminates on the substrate engaging surface, the at least one vacuum channel being configured to bias a substrate toward the substrate engaging surface upon application of a negative pressure to the at least one vacuum channel.

11. The apparatus of claim 8, wherein the electrical contact device further comprises a cathode contact ring.

12. The apparatus of claim 11, wherein the cathode contact ring further comprises an annularly shaped insulative body having a plurality of conductive electrical contacts radially positioned about the insulative body and partially extending therefrom and an annular sealing member positioned proximate the plurality of electrical contacts.

13. The apparatus of claim 12, wherein the annular sealing member is positioned radially outside of the plurality of conductive electrical contacts creating a dry contact configuration.

14. The apparatus of claim 12, wherein the annular sealing member is positioned radially inside the plurality of conductive electrical contacts creating a wet contact configuration.

15. The apparatus of claim 8, wherein the substrate holder assembly further comprises a vacuum chuck and the electrical contact device further comprises a cathode contact ring, the vacuum chuck being configured to support the substrate via engagement with the non-production side of the substrate.

16. An electro-chemical deposition processing cell, comprising:
   means for supporting a substrate via engagement with a non-production side of the substrate;
   means for electrically contacting the non-production side of the substrate comprising a cathode contact ring affixed to the means for supporting;
   an electrolyte container positioned proximate the means for supporting and having an anode disposed therein; and
   a power supply in electrical communication with the cathode and the anode;
   wherein the cathode contact ring further comprises an insulative body having a plurality of electrically conductive substrate contacts radially positioned about a perimeter of the insulative body.

17. An electro-chemical deposition processing cell, comprising:
   means for supporting a substrate via engagement with a non-production side of the substrate;
   means for electrically contacting the non-production side of the substrate comprising a cathode contact ring affixed to the means for supporting;
   an electrolyte container positioned proximate the means for supporting and having an anode disposed therein; and
   a power supply in electrical communication with the cathode and the anode;
   wherein the cathode contact ring further comprises an insulative body having an annular seal positioned radially outward from a plurality of electrical substrate contacts, the annular seal being configured to prevent electrolyte from flowing to the plurality of electrical substrate contacts.

18. A apparatus for depositing a metal layer on a substrate, comprising:

a rotatable cathode substrate support member configured to receive and support a substrate in a face up position;

an anode fluid dispensing nozzle assembly positioned above the cathode substrate support member;

a power supply in electrical communication with the cathode substrate support member and the anode fluid dispensing nozzle; and a system controller configured to regulate at least one of a rate of rotation of the anode substrate support member, a position of the cathode fluid dispensing nozzle, and an output power of the power supply.

19. The apparatus of claim 18, wherein the rotatable cathode substrate support member comprises:

a rotatably mounted shaft in communication with a motor, the motor being configured to impart rotational motion to the shaft; and a substrate support surface concentrically mounted to a distal end of the shaft, the substrate support surface being configured to receive a substrate in a face up position.

20. The apparatus of claim 19, wherein the substrate support surface further comprises an annular cathode contact ring positioned about a perimeter of the substrate support surface, the cathode contact ring having one or more electrical substrate contacts formed therein.

21. The apparatus of claim 20, wherein the cathode contact ring further comprises an annular seal member positioned radially outward from the plurality of electrical substrate contacts.

22. The apparatus of claim 20, wherein the one or more electrical contacts are in electrical communication with a negative output of the power supply.

23. The apparatus of claim 18, wherein the anode fluid dispensing nozzle is in electrical communication with a positive output of the power supply.

24. The apparatus of claim 18, wherein the substrate support member further comprises a substrate receiving surface having a plurality of apertures formed therein, each of the plurality of apertures being in communication with a vacuum source and configured to vacuum chuck the substrate to the substrate receiving surface.

25. The apparatus of claim 18, wherein the rotatable cathode substrate support is configured to support a substrate in a face-up position and to electrically contact a backside portion of the substrate.

26. The apparatus of claim 25, wherein the backside portion comprises a backside conductive layer deposited on a bevel and a backside portions of the substrate.

* * * * *

UNITED STATES PATENT AND TRADEMARK OFFICE
CERTIFICATE OF CORRECTION

PATENT NO. : 6,802,947 B2
DATED : October 12, 2004
INVENTOR(S) : Donald J.K. Olgado, Michael Wood and Dmitry Lubomirsky It is certified that error appears in the above-identified patent and that said Letters Patent is hereby corrected as shown below:

Column 1,
Line 59, please delete "1";

Column 3,
Line 44, please delete "foe" and insert -- for --;

Column 7,
Line 50, please delete "$2x10^8$" and insert -- $2x10^{-8}$ --; and
Line 52, please delete "$10.6x10^8$" and insert -- $10.6x10^{-8}$ --.

Signed and Sealed this

Seventh Day of June, 2005

JON W. DUDAS
*Director of the United States Patent and Trademark Office*